(12) United States Patent
Komatsu et al.

(10) Patent No.: US 11,569,212 B2
(45) Date of Patent: Jan. 31, 2023

(54) SEMICONDUCTOR DEVICE POWER MANAGEMENT SYSTEM

(71) Applicant: INTERNATIONAL FRONTIER TECHNOLOGY LABORATORY, INC., Tokyo (JP)

(72) Inventors: Nobuaki Komatsu, Tokyo (JP); Tomoko Ito, Tokyo (JP)

(73) Assignee: INTERNATIONAL FRONTIER TECHNOLOGY LABORATORY, INC., Tokyo (JP)

( * ) Notice: Subject to any disclaimer, the term of this patent is extended or adjusted under 35 U.S.C. 154(b) by 244 days.

(21) Appl. No.: 16/761,558

(22) PCT Filed: Nov. 9, 2017

(86) PCT No.: PCT/JP2017/040406
§ 371 (c)(1),
(2) Date: May 5, 2020

(87) PCT Pub. No.: WO2019/092827
PCT Pub. Date: May 19, 2019

(65) Prior Publication Data
US 2020/0266006 A1 Aug. 20, 2020

(51) Int. Cl.
*H01L 25/16* (2006.01)
*H01G 9/20* (2006.01)
*H01G 9/28* (2006.01)
*H01L 23/538* (2006.01)
*G01N 21/00* (2006.01)
(Continued)

(52) U.S. Cl.
CPC ............ *H01L 25/167* (2013.01); *H01G 9/209* (2013.01); *H01G 9/2027* (2013.01); *H01G 9/2068* (2013.01); *H01G 9/28* (2013.01);

*G01N 21/00* (2013.01); *G01N 27/00* (2013.01); *G06V 40/00* (2022.01); *G08C 19/00* (2013.01); *H01G 9/2031* (2013.01); *H01G 9/2059* (2013.01); *H01L 23/538* (2013.01); *H01L 25/16* (2013.01);
(Continued)

(58) Field of Classification Search
CPC ................................................... H01G 9/2027
See application file for complete search history.

(56) References Cited

U.S. PATENT DOCUMENTS

2003/0152815 A1* 8/2003 LaFollette ......... H01M 10/0436
429/185
2004/0018421 A1 1/2004 LaFollette
(Continued)

FOREIGN PATENT DOCUMENTS

JP 10-188182 A 7/1998
JP 2004-079333 A 3/2004
(Continued)

OTHER PUBLICATIONS

International Search Report and Written Opinion dated Feb. 6, 2018 for PCT Application No. PCT/JP2017/040406.

*Primary Examiner* — Tucker J Wright
(74) *Attorney, Agent, or Firm* — Renner, Otto, Boisselle & Sklar, LLP

(57) ABSTRACT

Aspects of the disclosure relate to a semiconductor device power management system including a semiconductor device of a set of semiconductor devices provided on a substrate, wherein the semiconductor device includes an independent power supply unit.

15 Claims, 5 Drawing Sheets

(51) Int. Cl.
    *G01N 27/00*     (2006.01)
    *G08C 19/00*     (2006.01)
    *H02J 7/35*      (2006.01)
    *H02J 7/34*      (2006.01)
    *G06V 40/00*     (2022.01)

(52) U.S. Cl.
    CPC ................ *H02J 7/345* (2013.01); *H02J 7/35* (2013.01); *H02J 2300/24* (2020.01)

(56) References Cited

U.S. PATENT DOCUMENTS

| | | |
|---|---|---|
| 2006/0284302 A1 | 12/2006 | Kim |
| 2007/0029883 A1 | 2/2007 | Koshida |
| 2009/0103161 A1 | 4/2009 | Kothari |
| 2014/0060630 A1 | 3/2014 | Komatsu |
| 2016/0086738 A1 | 3/2016 | Takayasu |

FOREIGN PATENT DOCUMENTS

| | | |
|---|---|---|
| JP | 2004-281593 A | 10/2004 |
| JP | 2011-008967 A | 1/2011 |

\* cited by examiner

| Illuminance | | lux | 50 | 100 | 150 | 200 |
|---|---|---|---|---|---|---|
| Maximum Output Values per Unit Area | | µW/cm² | 1.88 | 4.41 | 6.82 | 10.15 |
| 1 Cell Power Generation Area 1cm² | Maximum Output Voltage | V | 0.38 | 0.4 | 0.45 | 0.47 |
| | Maximum Output Current | µA | 4.95 | 10.76 | 15.16 | 21.60 |
| 4 Serial Cells Power Generation Area 1cm² | Maximum Output Voltage | V | 1.52 | 1.64 | 1.8 | 1.88 |
| | Maximum Output Current | µA | 1.24 | 2.69 | 3.79 | 5.40 |

SEMICONDUCTOR DEVICE POWER MANAGEMENT SYSTEM

TECHNICAL FIELD

The present invention relates generally to a power management system for semiconductor devices, and more particularly relates to a set of semiconductor devices that each include an independent power supply unit.

BACKGROUND ART

In recent years, the demand for integrated circuit devices capable of performing a variety of functions is increasing. As an example, in the field of Internet of Things, a single sensor device may contain sensor controllers configured to collect and manage environmental data (e.g., temperature data, humidity data, pressure data), processing units configured to process the collected data (e.g., interpret, sort, and organize the data), and wireless transmission units configured to transmit the collected data to other devices for analysis. Accordingly, in order to satisfy the demand for increasing functionality, an increasing number of semiconductor devices are placed on integrated circuit substrates. As the number of semiconductor devices placed on substrates increases, so too does the need for efficient power supply systems to power each semiconductor device placed thereon.

In conventional power management systems, a single power supply unit is used to provide power to a plurality of semiconductor devices. For instance, circuits and through-silicon-vias (TSVs) may be formed on substrates in order to route the power from the power supply unit to the plurality of semiconductor devices, increasing circuit complexity and limiting the flexibility of the semiconductor devices located thereon. For example, Patent Literature 1 discloses an invention for a display with an integrated photovoltaic cell in which a single power supply is used to provide power to a processor, a driver controller, a transceiver, an antenna, and other devices.

CITATION LIST

Patent Literature

[PTL 1]
US Patent Application Publication No. US2009/0103161A1

SUMMARY OF INVENTION

Technical Problem

Aspects of the disclosure relate to the recognition that, in conventional integrated circuit devices, having a single power supply unit may increase overall circuit complexity, and limit the flexibility of semiconductor devices to be used for different purposes. For example, in certain integrated circuit devices, it may be desirable to control the power provided to particular semiconductor devices on an individual basis, such that the on-off state of particular devices may be managed with greater freedom. However, the power supply units of conventional integrated circuit devices do not allow such granular control over the power delivered to semiconductor devices. Patent Literature 1, for instance, makes no reference to independent power supply units for each onboard device.

Solution to Problem

Accordingly, aspects of the present disclosure relate to a semiconductor device power management system including a semiconductor device of a set of semiconductor devices provided on a substrate, wherein the semiconductor device includes an independent power supply unit. In embodiments, the independent power supply unit may be a silicon dioxide photocell configured to generate electricity from incident light to power the set of semiconductor devices.

Advantageous Effects of Invention

According to the present invention, it is possible to manage power delivery to semiconductor devices on an individual basis, facilitating the flexibility of integrated circuit devices. Aspects of the present invention may be associated with benefits such as power delivery performance and efficiency, and semiconductor device service life longevity (e.g., having multiple power supply units may mitigate the likelihood of a single failure compromising all the devices on a substrate).

BRIEF DESCRIPTION OF DRAWINGS

FIG. 6 illustrates a table of output values per unit area by luminance for a photocell, according to embodiments.

DESCRIPTION OF EMBODIMENT(S)

Hereinafter, embodiments of the present invention will be described with reference to the Figures. It should be noted that the embodiments described herein are not intended to limit the invention according to the claims, and it is to be understood that each of the elements and combinations thereof described with respect to the embodiments are not strictly necessary to implement the aspects of the present invention.

Figure 1:
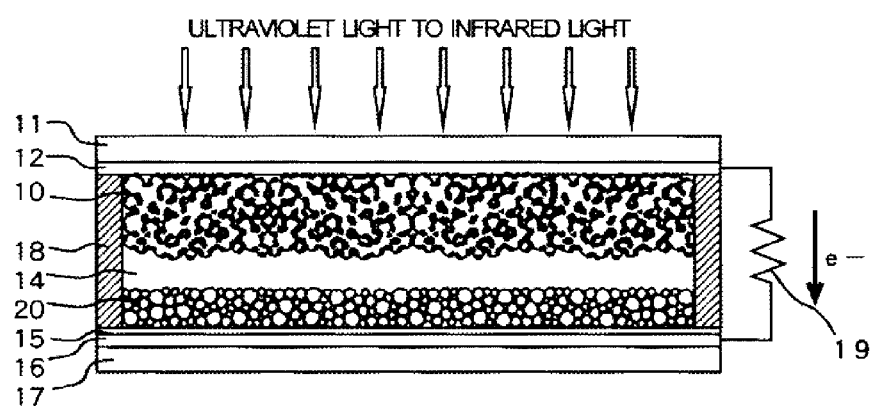
FIG. 1 illustrates a diagrammatic view of a silicon dioxide photocell according to embodiments.

FIG. 1 illustrates a diagrammatic view of a silicon dioxide photocell 100 according to embodiments. The photocell 100 may be a tandem configuration between a silicon dioxide photocell and a dye-sensitized titanium dioxide photocell. In embodiments, the silicon dioxide photocell may include two substrates that each have an electrically conductive side, and the two substrates may be arranged such that the respective electrically conductive sides are facing each other. A first substrate of the two substrates may be transparent on a light incident side. A silicon dioxide particle compact and an electrolyte may be provided between the two substrates. The silicon dioxide particle compact may be provided on a second substrate of the two substrates that is arranged to face the first substrate transparent on the light incident side. The space between the silicon dioxide particle compact and the first substrate on the light incident side may be filled with the electrolyte.

In embodiments, with reference to FIG. 1, numeral 11 may represent a transparent substrate made of glass or resin formed on a surface of a transparent conductive layer 12 made of a fluorine-doped tin oxide (FTO, or $SnO_2$:F) or the like, which may serve as an electrode on a light incident side. In embodiments, numeral 10 may represent a porous titanium dioxide which is solidified by a method such as sintering, and which has absorbed a sensitizing dye such as a ruthenium complex dye. Numeral 14 represents an electrolytic solution. In embodiments, the electrolytic solution may include an iodine electrolyte having iodine dissolved in an aqueous potassium iodide solution.

Numeral 20 represents pulverized synthetic quartz particles having a particle diameter of approximately 500 nanometers or less, which are mixed with ethanol and applied onto an electrode 15 made of platinum or the like and subsequently dried. As additional examples, the silicon dioxide particles may include synthetic quartz particles, fused quartz glass particles, non-alkali glass particles, or borosilicate glass particles. Numeral 16 represents a transparent electrode made of FTO or the like, and numeral 17 represents a substrate made of glass or a resin. Numeral 18 represents a sealing material, and numeral 19 represents an external load.

Light (e.g., ultraviolet light, infrared light, visible light) may enter from the transparent substrate 11 on the light incident side of the substrate. Among the ultraviolet light and infrared light that enters from the transparent substrate 11 on the light incident side, light in the ultraviolet and visible light range may enter the dye-sensitized porous titanium dioxide 10 to generate electricity therein, and the light in the ultraviolet to infrared range of the spectrum which does not contribute to the generation of electricity in the porous titanium dioxide 10 may enter the silicon dioxide 20 to generate electricity therein.

As such, in embodiments, the silicon dioxide 20 is able to produce electricity even using light in the range of the spectrum between visible light and infrared light, which does not produce electricity with the titanium dioxide and sensitizing dye. In this way, the photocell according to the present disclosure can utilize light throughout the entire spectrum from ultraviolet light to infrared light for electricity generation.

Figure 2:
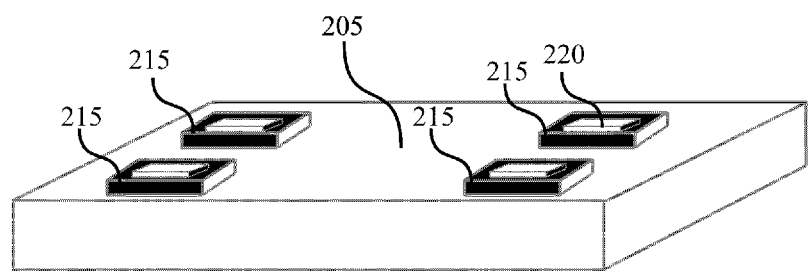
FIG. 2 illustrates a diagrammatic view of a set of semiconductor devices with independent power supply units stacked on a substrate, according to embodiments.

FIG. 2 illustrates a diagrammatic view 200 of a set of semiconductor devices 215 with independent power supply units 220 stacked on a substrate 205. Aspects of FIG. 2 relate to a substrate 205 on which a set of semiconductor devices 215 are provided.

The substrate 205 may include a wafer structured from silicon, silicon dioxide, aluminum oxide, sapphire, germanium, gallium arsenide, an alloy of silicon and germanium, indium phosphide, a combination thereof, or another substance. A variety of electronic devices such as transistors, diodes, and integrated circuits may be deposited on the substrate 205. In embodiments, the set of semiconductor devices 215 provided on the substrate may be configured to carry out functions as part of a single application or a variety of applications. As examples, the substrate 205 and the semiconductor devices 215 provided thereon may constitute a motherboard for a computing device such as a desktop computer, laptop computer, server, sensor device, mobile device (e.g., smartphone, tablet, smartwatch) or the like.

In embodiments, each of the set of semiconductor devices 215 may include an independent power supply unit 220. A separate independent power supply unit 220 may be connected to each of the set of semiconductor devices 215, respectively, such that each semiconductor device 215 has access to its own dedicated power supply. As described herein, in embodiments, the independent power supply unit 220 of each semiconductor device 215 may be a photocell configured to generate electricity from naturally incident light. In particular, the photocell may be a silicon-dioxide photocell, a dye-sensitized titanium dioxide photocell, or a tandem configuration utilizing both a silicon-dioxide layer and a dye-sensitized titanium dioxide layer (e.g., a photocell such as the photocell illustrated in FIG. 1). In embodiments, light that is naturally incident on the photocell (e.g., light from the sun, light from artificial light fixtures, fluorescent lights, etc.) may enter into the photocell and initiate an electro-chemical reaction with the silicon-dioxide or titanium dioxide located therein to generate a current that may be used to power the set of semiconductor devices 215. In embodiments, the independent power supply unit 220 may be configured to store the generated electricity in a capacitor. In certain embodiments, the capacitor may be integrated within the independent power supply unit (e.g., photocell) 220 as one unit. In embodiments, the independent power supply unit (e.g., photocell) 220 may be configured to function as a capacitor. Alternatively, the capacitor may be located externally to the independent power supply unit 220. In embodiments, the independent power supply unit 220 may be connected to a bypass condenser through which the generated electricity may be provided to the set of semiconductor devices 215. Other configurations of the photocell are also possible.

Aspects of the disclosure relate to the recognition that, in certain situations, different semiconductor devices may have different power requirements, and be active at different times. As an example, in certain embodiments, a sensor device in an Internet of Things (IoT) environment may include semiconductor devices configured to continuously monitor (e.g., and therefore continuously require power) for changes in a particular environment as well as semiconductor devices configured to broadcast collected data when it is available (e.g., such that they only need power when data is collected and ready for transmission). Accordingly, aspects of the present disclosure relate to a semiconductor device power management system including a first subset of semiconductor devices configured to alternate between an on-state and an off-state, and a second subset of semiconductor devices configured to remain in the on-state. Further, in embodiments, aspects of the disclosure relate to a semiconductor device power management system in which an electrical circuit is connected between semiconductor devices and their corresponding power supply units without passing through an off-switch. That is, as the on-off state of each semiconductor device may be managed directly by its corresponding power supply unit, there is no need for a separate on-off switch to manage the on-off state of each semiconductor device. Such a configuration may be associated with integrated circuit efficiency, flexibility, and reduced complexity.

Generally, the on-state may refer to an active state in which the semiconductor devices 215 are receiving power, executing instructions, and performing operations to carry-out functions. In contrast, the off-state may refer to an inactive state in which the semiconductor devices 215 are not using power, and are awaiting start-up in a disabled state (e.g., sleep state). In certain embodiments, the on-off state of the set of semiconductor devices 215 may be configured on an individual basis for each semiconductor device 215 using the independent power supply units 220. In particular, the power supply unit 220 may be configured to supply power to the first subset of semiconductor devices in order to set them to the on-state, and cease power transmission to the first subset of semiconductor devices in order to set them to the off state. For instance, in embodiments, a power supply unit 220 may be configured to alternate the first subset of semiconductor devices between the on-state and the off-state in response to a user input (e.g., user instruction to activate the functionality of the set of semiconductor devices). In certain embodiments, a power supply unit 220 may be configured to alternate the first subset of semiconductor devices between the on-state and the off-state in response to a triggering event (e.g., detection of data, measurement value above a threshold, change in the surrounding environment, data/resource availability).

Aspects of the disclosure relate to the recognition that, in many cases, conventional semiconductor devices are set to an off-state in order to save power when they are not in use. However, aspects of the disclosure relate to the recognition that switching semiconductor devices between the on and off state can have negative impacts on service life and data reliability (e.g., turning the semiconductor devices on and off may delete unsaved data, and shorten device life spans). As described herein, in embodiments, the set of semiconductor devices 215 may include a second subset of semiconductor devices configured to continuously remain in the on-state. According to the independent power supply unit 220 of the present invention, semiconductor devices 215 may be maintained in a low-power mode to facilitate data reliability and service life longevity. As described herein, the independent power supply unit 220 may be configured to continuously supply power to the second subset of semiconductor devices to maintain them in the on-state to perform designated operations.

In embodiments, the second subset of semiconductor devices may be configured to operate as sensors to collect a set of contextual data regarding a surrounding environment of the substrate 205. Generally, the set of contextual data may include a collection of structured or unstructured data that indicates, defines, describes, or otherwise characterizes the surrounding environment of the substrate 205. Herein, the surrounding environment may refer to the surroundings, climate, location, setting, or circumstances of the area in which the substrate 205 is provided. As examples, the surrounding environment may include a home environment, health care facility, factory, office building, road/highway, network communication environment, or the like. In embodiments, collecting the set of contextual data may include detecting, analyzing, sensing, receiving, collecting, gathering, transforming, importing, or otherwise capturing the set of contextual data from the surrounding environment. For example, the second subset of semiconductor devices may be configured to function as sensors such as cameras, microphones, thermal cameras, motion sensors, thermometers, vibration detectors, photodetectors, barometers, hydrometers, capacitance sensors, accelerometers, and other sensors to collect the set of contextual data.

In embodiments, the set of contextual data may include a set of biometric data. The set of biometric data may include a collection of information that characterizes the state of a biological organism. As examples, the set of biometric data may include heart rate data, fingerprint data, blood pressure data, DNA data, facial data, handwriting data, or the like. In addition, the set of contextual data may include a set of environmental data. The set of environmental data may include information that characterizes the state of a natural or artificial setting. As examples, the set of environmental data may include temperature data, pressure data, humidity data, distance data, mass/weight data, specific gravity data, air quality data, and the like. In addition, the set of contextual data may include a set of luminescence data. The set of luminescence data may include information that characterizes the quality or quantity of incident light. For example, the set of luminescence data may include wavelength data, illumination magnitude data, radioactivity data, reflectivity data, photon scattering data, or the like. In addition, the set of contextual data may include a set of security data. The set of security data may include information that characterizes the authentication of users, trustworthiness of data, and degree of safety of individuals, objects, or data. As examples, the set of security data may include the open/close status of a door or lock, the credentials of a user, verification criteria, status of data traffic (e.g., normal or abnormal), password data, or the like. In addition, the set of contextual data may include a set of chemical data. The set of chemical data may include information that characterizes the chemical composition of a substance. As examples, the set of chemical data may indicate pH data, chemical concentration data, element identification data, or the like. In addition, the set of contextual data may include a set of infrastructure data. The set of infrastructure data may include information that characterizes an infrastructure state. For example, the set of infrastructure data may include structural integrity data, vibration data, breakage/crack data, minimum/maximum capacity data, and the like. Other types of contextual data are also possible.

In embodiments, the first subset of semiconductor devices may be configured to transmit a sensor result signal. Generally, transmitting can include relaying, broadcasting, passing-on, transmitting, routing, or otherwise conveying the sensor result signal. The sensor result signal may include a report, notification, or other indication of the resulting contextual data collected by the second subset of semiconductor devices. As an example, the sensor result signal may include a notification of a temperature value (e.g., 28 degrees Celsius) collected by a CPU temperature monitor. In embodiments, transmitting may include sending the sensor result signal from the set of semiconductor devices 215 to a centralized management unit (e.g., server, data orchestration platform) for analysis, interpretation, and processing. Other methods of transmitting the sensor result signal are also possible.

Consider the following example. The substrate 205 of FIG. 2 may be utilized within a biometric sensor device in a wearable smart watch device. The substrate 205 may include a set of semiconductor devices 215 including a main CPU, a radio frequency (RF) core, and a sensor controller. Each of the main CPU, the RF core, and the sensor controller may be connected to a silicon dioxide photocell that serves as an independent power supply unit 220. In embodiments, as described herein, the main CPU and the sensor controller may comprise a second subset of semiconductor devices configured to remain in an on-state. In this way, both the sensor controller and the main CPU may continuously function to monitor biometric data (e.g., heart rate data, blood pressure data) for the user and perform processing operations to implement the functions of the smart watch using electricity supplied by the respective photocells. In embodiments, the RF core may comprise a first subset of semiconductor devices configured to alternate between an on-state and an off-state (e.g., the photocell to which it is connected only supplies electricity to turn it on when necessary). In this way, the RF core may only be turned-on by the photocell to transmit data in response to a triggering event. For example, in response to detecting a heart rate that achieves a predetermined threshold, the photocell connected to the RF core may supply electricity to turn it on, and the RF core may transmit a sensor result signal indicating the heart-rate value to a centralized processing engine. Other configurations of the substrate 205, the set of semiconductor devices 215, and the independent power supply units 220 are also possible.

Figure 3:
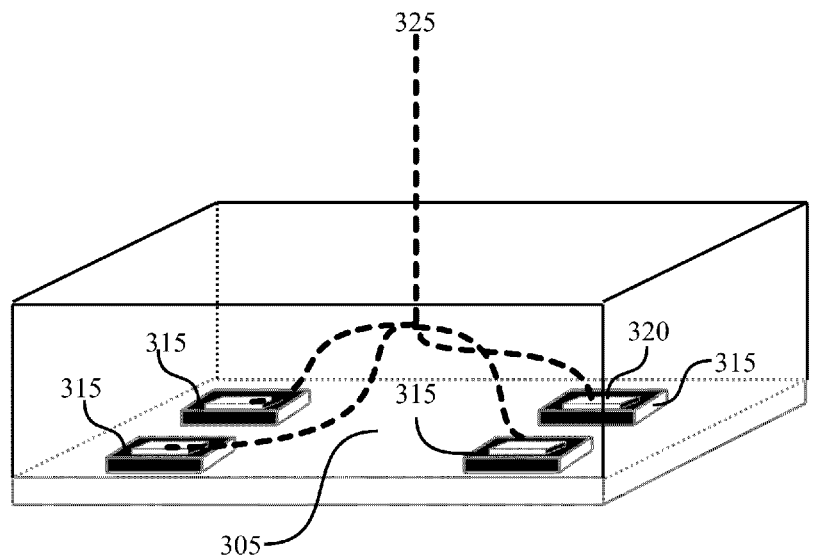
FIG. 3 illustrates a diagrammatic view of a set of semiconductor devices with independent power supply units connected to fiber optic cables, according to embodiments.

FIG. 3 illustrates a diagrammatic view 300 of a set of semiconductor devices 315 with independent power supply units 320 connected to fiber optic cables 325. Aspects of the disclosure relate to the recognition that, in some situations, the substrate 305 may be configured in a way such that light is not naturally incident on the photocells that serve as the independent power supply units 320. For example, the substrate 305 may be enclosed within the case of a sensor device, a server, smartphone, or other computing device, such that light cannot naturally reach the photocells that serve as the independent power supply units 320. Accordingly, aspects of the disclosure relate to a configuration in one or more fiber optic cables 325 located external to the substrate may be used to convey external light to the set of independent power supply units 320, and the set of independent power supply units 320 may subsequently leverage the light from the fiber optic cables 325 to generate electricity to power the set of semiconductor devices 325. Accordingly, as the silicon dioxide photocell of the present invention is capable of generating substantially more electricity than conventional photocells, the light provided from the set of fiber optic cables 325 may be sufficient to generate enough electricity to power the set of semiconductor devices 315 (as will be described in detail below).

In certain embodiments, a separate fiber optic cable 325 may be provided for each individual independent power supply unit 325. According to this configuration, even were a single fiber optic cable 325 to break/malfunction, as each of the independent power supply units 325 has its own dedicated fiber optic cable, the impact of the broken fiber optic cable 325 may be mitigated, and functionality of the majority of the set of semiconductor devices 315 may be maintained. In certain embodiments, as shown in FIG. 3, light from a single fiber optic cable may be split between each of the set of independent power supply units 325. Such a configuration may be associated with benefits such as simplicity and cost efficiency. Other configurations of the set of fiber optic cables 325 are also possible.

Figure 4:
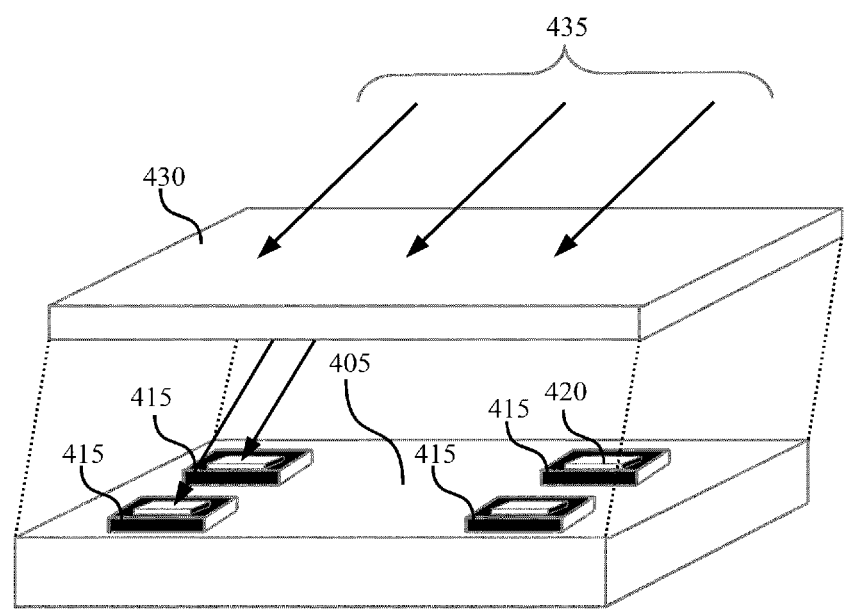
FIG. 4 illustrates a diagrammatic view of a set of semiconductor devices with independent power supply units configured to receive light from an external material, according to embodiments.

FIG. 4 illustrates a diagrammatic view 400 of a set of semiconductor devices 415 with independent power supply units 420 configured to receive light from an external material 430. Aspects of FIG. 4 relate to a set of independent power supply units 420 configured to generate electricity using light from an external material 430 (e.g., a semi-translucent material, a phosphorescent material, a light-emitting material).

As described herein, aspects of the disclosure relate to a set of independent power supply units 420 configured to generate electricity using light 435 from an external material 430. In embodiments, the external material 430 may be stacked on top of the substrate 405 on which the set of semiconductor devices 415 and the set of independent power supply units 420 are located. In embodiments, the external material 430 may be structured from one or more substances configured to transmit or generate light. Accordingly, the set of independent power supply units 420 may be configured to utilize the light 435 from the external material 430 to generate electricity to power the set of semiconductor devices 415. Although the external material 430 is depicted as a single piece in FIG. 4, embodiments in which the external material 430 is divided into a plurality of pieces are also possible. As an example, the external material 430 may be divided into 4 pieces, wherein each piece is located directly above one of the independent power supply units 420 (e.g., such that each independent power supply unit 420 can use the light 435 from the external material 430 to generate electricity to power the set of semiconductor devices 415).

In embodiments, aspects of the disclosure relate to a semiconductor power device management system having a set of independent power supply units 420 configured to generate electricity using light 435 from an external material 430 structured from a semi-translucent material. In embodiments, the semi-translucent material may be provided directly on top of the substrate 405. In certain embodiments, the semi-translucent material may be provided a distance above the top of the substrate 405. Generally, the translucent material may include a substance that allows light 435 to pass through in a scattered or un-scattered state (e.g., transparent). More particularly, the translucent material may be configured to pass light of a certain wavelength or frequency, and block light of another wavelength or frequency. As examples, in certain embodiments, the semi-translucent material may include glass, plastic, sapphire, diamond, or other substance capable of permitting the transmission of light. As an example, in embodiments, the external material 430 may be structured from a glass material (e.g., translucent material) having a transmittance factor of 70%. Accordingly, the light 435 transmitted through the glass material may be incident on the photocells serving as the set of independent power supply units 420, which may generate electricity to power the set of semiconductor devices 415. Other types of semi-translucent materials for the external material 430 are also possible.

In embodiments, aspects of the disclosure relate to a semiconductor power device management system having a set of independent power supply units 420 configured to generate electricity using light 435 from an external material 430 structured from a phosphorescent material. As described herein, the phosphorescent material may be provided directly on top of the substrate 405. In certain embodiments, the semi-translucent material may be provided a distance above the top of the substrate 405. In embodiments, the phosphorescent material may include a substance configured to accumulate light 435 and subsequently radiate it. The phosphorescent material may generate light 435 from one or more of bioluminescence, chemoluminescence, electroluminescence, photoluminescence, rontgenoluminescence, sonoluminescence, thermoluminescence, or triboluminescence In embodiments, the light 435 accumulated by the phosphorescent material may be radiated immediately after incidence. In certain embodiments, the light 435 accumulated by the phosphorescent material may be maintained, stored, and radiated at a later time. As examples, the phosphorescent material may include zinc sulfide, strontium aluminate, calcium sulfide, indium phosphide, gallium arsenide, gallium nitride, or the like. Accordingly, as described herein, light 435 transmitted from the phosphorescent material may be incident on the photocells serving as the set of independent power supply units 420, which may generate electricity to power the set of semiconductor devices 415. Other types of phosphorescent materials for the external material 430 are also possible.

In embodiments, aspects of the disclosure relate to a semiconductor power device management system having a set of independent power supply units 420 configured to generate electricity using light 435 from an external material 430 structured from a light-producing material. As described herein, the light-producing material may be provided directly on top of the substrate 405. In certain embodiments, the light-producing material may be provided a distance above the top of the substrate 405. In embodiments, the light-producing material may include a substance configured to generate and radiate light 435. The light-producing material may include an artificial light-producing device or a natural luminescent body. In embodiments, the light-producing material may produce light from chemical reactions, electrical energy, subatomic motions (e.g., stress on a crystal), spontaneous emission, or the like. As examples, the light-producing material may include a light bulb, a light emitting diode (LED), an incandescent body, luminescent body, or the like. Accordingly, as described herein, light 435 transmitted from the light-producing material may be incident on the photocells serving as the set of independent power supply units 420, which may generate electricity to power the set of semiconductor devices 415. Other types of light-producing materials for the external material 430 are also possible.

Figure 5:
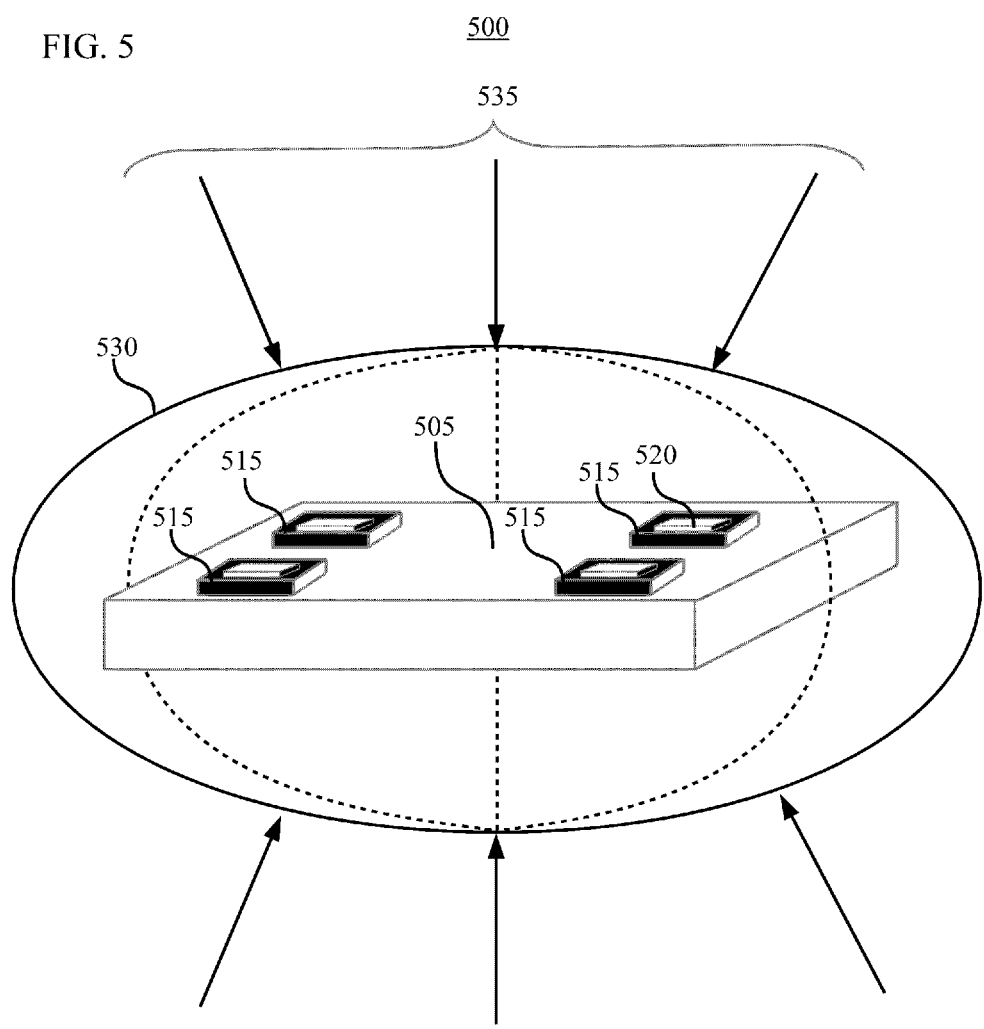
FIG. 5 illustrates a diagrammatic view of a set of semiconductor devices with independent power supply units on a substrate surrounded by a reflective material, according to embodiments.

FIG. 5 illustrates a diagrammatic view 500 of a set of semiconductor devices 515 with independent power supply units 520 on a substrate 505 surrounded by a reflective material 530. Aspects of FIG. 5 relate to a set of independent power supply units 520 configured to generate electricity using light from a reflective material 530 surrounding the substrate 505.

Aspects of the disclosure relate to the recognition that, in certain embodiments, enclosing the substrate 505 with a reflective material 530 may facilitate transmission of light 535 to the photocells serving as the set of independent power supply units 520, and thereby positively impact the generation of electricity for use by the set of semiconductor devices 515. In embodiments, the reflective material 530 may be provided in an ovoid-shape configured to completely enclose the substrate 505. In certain embodiments, the reflective material 530 may be configured to have a translucent (e.g., transparent or semi-transparent) outer surface and a reflective inner surface. In this way, light 535 may pass through the translucent outer surface of the reflective material 530 to be incident on the photocells serving as the set of independent power supply units 520, and light scattered off the substrate 505 may reflect back off of the reflective inner surface of the reflective material 530 to be incident upon the photocells. As such, a large portion of the light 535 incident on the outer surface of the reflective material 530 may be gathered and directed to the photocells to facilitate electricity generation to power the set of semiconductor devices 515. As examples, the reflective material 530 may be structured from a reflective glass, plastic, mineral, or other substance. In certain embodiments, the reflective material 530 may include a plurality of concave portions formed in its outer surface configured to facilitate the gathering and directing of light 535 to the independent power supply units 520. Other types of reflective material 530 are also possible.

FIG. 6 illustrates a table 600 of output values per unit area by luminance for a photocell according to embodiments. As described herein, aspects of the disclosure relate to using a silicon dioxide photocell (or a silicon dioxide and dye-sensitized titanium dioxide photocell) to generate electricity to power a set of semiconductor devices. As shown in FIG. 6, table 600 illustrates the maximum output voltage and maximum output current of the photocell of the present disclosure per unit area with respect to a provided luminance. For example, as illustrated in table 600, provided a light source of 50 lux, a single 1 $cm^2$ area photocell is able to achieve an output voltage of 0.38 volts and an output current of 4.95 μA. When the light source provides 200 lux of luminance, a single $cm^2$ area photocell is able to achieve an output voltage of 0.47 volts and 21.60 μA. In certain embodiments, aspects of the disclosure relate to the recognition that in some cases, particular semiconductor devices may be able to run on a low voltage, while other semiconductor devices require a higher voltage but only a small amount of current. Accordingly, aspects of the disclosure relate to arranging 4 1-$cm^2$ photocells in a serial configuration in order to provide a greater output voltage while maintaining a substantially small current. Accordingly, as illustrated by the table 600, in the event that a 100 lux light source is provided, the arrangement of 4 serial photocells may achieve an output voltage of 1.64 volts and an output current of 2.64 μA.

For the sake of example, the output currents of the photocell of the present invention will be compared with respect to the current requirements of common semiconductor devices. Generally, sensor devices (e.g., for temperature data collection, humidity data collection, signal processing, and analog front end) require between 5-10 μA, memory control units require approximately 10 μA, CPUs require between 1-20 μA, and wireless controllers require approximately 50 μA once every 20 seconds. Similarly, CMOS and MEMS devices with voltage requirements in the nanowatt range are also growing in availability. Accordingly, given a sufficient light source, it can be seen that even a single photocell of the present disclosure is capable of generating a sufficient amount of current to power these common semiconductor devices. Note that the values listed in table 600 are merely presented for the purpose of example, and other configurations of the set of photocells are also possible.

Figure 7:
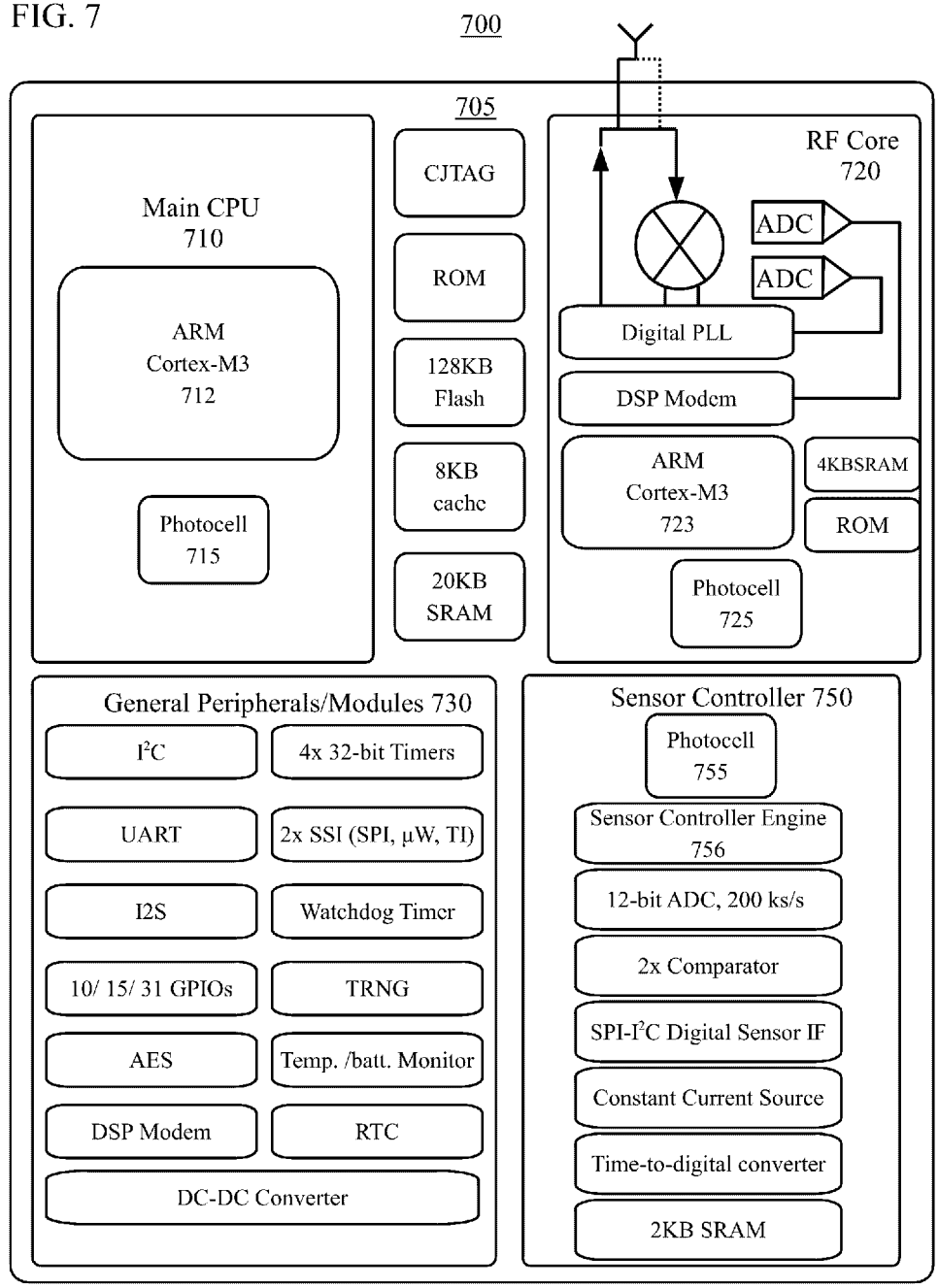
FIG. 7 illustrates an example of a high-level system architecture of a set of semiconductor devices equipped with independent power supply units.

FIG. 7 illustrates an example of a high-level system architecture 700 of a set of semiconductor devices equipped with independent power supply units. Aspects of FIG. 7 relate to a substrate 705 on which a set of semiconductor devices are provided. As described herein, the substrate 705 may include a wafer structured from silicon, silicon dioxide, aluminum oxide, sapphire, germanium, gallium arsenide, an alloy of silicon and germanium, indium phosphide, a combination thereof, or another substance. A variety of electronic devices such as transistors, diodes, and integrated circuits may be deposited on the substrate 705. In embodiments, the set of semiconductor devices provided on the substrate may be configured to carry out functions as part of a single application or a variety of applications. As an example, the substrate 705 and the semiconductor devices provided thereon may constitute a motherboard for a sensor device (e.g., temperature sensor, humidity sensor, pressure sensor) in an Internet of Things environment. As described herein, each of the set of semiconductor devices may include an independent power supply unit. The independent power supply unit of each semiconductor device may be a photocell configured to generate electricity from incident light. In particular, the photocell may be a silicon-dioxide photocell, a dye-sensitized titanium dioxide photocell, or a tandem configuration utilizing both a silicon-dioxide layer and a dye-sensitized titanium dioxide layer. Other configurations of the photocell are also possible.

As illustrated in FIG. 7, the set of semiconductor devices provided on the substrate 705 may include a main CPU 710, an RF core 720, a set of general peripherals/modules 730, and a sensor controller 750. In embodiments, each of the set of semiconductor devices may include a variety of sub-units and sub-modules configured to facilitate execution of instructions provided by the applications carried out by the set of semiconductor devices on the substrate 705. However, it should be noted that the units and modules depicted in FIG. 7 are merely illustrated for the sake of example, and the present invention is not limited to the semiconductor devices or peripheral modules shown herein. For instance, although the main CPU 210 is depicted as having an ARM Cortex-M3 processor 712 (registered trademark), this is merely an example used for the purposes of illustration, and a variety of other processors may be used instead. As additional examples, the set of semiconductor devices may include memory controller units (MCUs), complementary metal oxide semiconductors (CMOS), microelectromechanical systems (MEMS), or the like. Other types of semiconductor devices are also possible.

In embodiments, aspects of the present disclosure relate to a semiconductor device power management system including a set of semiconductors in which each semiconductor device of the set of semiconductor devices has an independent power supply unit. In particular, a separate independent power supply unit may be provided within each individual semiconductor device of the set of semiconductor devices, respectively, such that each semiconductor device has access to its own dedicated power supply. As described herein, in embodiments, the independent power supply unit of each semiconductor device may be a photocell configured to generate electricity from incident light. In particular, the photocell may be a silicon-dioxide photocell, a dye-sensitized titanium dioxide photocell, or a tandem configuration utilizing both a silicon-dioxide layer and a dye-sensitized titanium dioxide layer. As an example, with reference to FIG. 7, the main CPU 710 may include a photocell 715 configured to provide power to the ARM Cortex-M3 processor 712, the RF core 720 may include a photocell 725 configured to provide power to the ARM Cortex-M2 processor 723 and other devices of the RF core 720, and the sensor controller 750 may include a photocell 755 configured to provide power to the sensor controller engine 756 and other modules of the sensor controller 750. Note that in the present embodiment, although the set of general peripherals/modules 730 is not depicted as having its own photocell or independent power supply unit in FIG. 7, configurations in which an independent power supply unit (e.g., photocell) is provided to power the modules therein are also possible. Other configurations of the set of semiconductor devices and the independent power supply units are also possible.

Consider the following example. Generally, the ARM Cortex-M3 processors 712 and 723 of substrate 705 may require approximately 61 µA per 1 MHz with a maximum operating frequency of 48 MHz, and the sensor controller engine 756 may require approximately 8 µA per 1 MHz with a maximum operating frequency of 24 MHz. Accordingly, calculating the current requirements of the ARM Cortex-M3 processors 712, 723 yields a value of 2.92 µA at maximum load (e.g., 61 µA*48 MHz*(1/1000)), and calculating the current requirements of the sensor controller engine 756 yields a value of 0.19 µA at maximum load (e.g., 8 µA*24 MHz*(1/1000)). As illustrated in FIG. 7, a photocell 715 may be connected to the ARM Cortex-M3 processor 712, a photocell 725 may be connected to the ARM Cortex-M3 processor, and a photocell 755 may be connected to the sensor controller engine 756. As illustrated in FIG. 6, the photocells of the present disclosure are capable of generating 4.95 µA using even a 50 lux light source, which is enough to satisfy the current requirements of the ARM Cortex-M3 processors 712, 723 and the sensor controller engine 756. Accordingly, leveraging silicon dioxide photocells as independent power supply units may facilitate operation and performance of semiconductor devices in a variety of applications. Other methods of configuring the set of semiconductor devices and the independent power supply units are also possible.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s).

While the foregoing is directed to exemplary embodiments, other and further embodiments of the invention may be devised without departing from the basic scope thereof, and the scope thereof is determined by the claims that follow. The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. "Set of," "group of," "bunch of," etc. are intended to include one or more. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

REFERENCE SIGNS LIST

10 Porous Titanium Dioxide
11 Transparent Layer
12 Conductive layer
14 Electrolytic Solution
15 Electrode
16 Transparent Electrode
17 Substrate
18 Sealing Material
19 External Load
20 Pulverized Synthetic Quartz Particles
205, 305, 405, 705 Substrate
215, 315, 415, 515, Semiconductor Device
220, 320, 420, 520, Independent Power Supply Unit
325 Fiber Optic Cable
430 External Material
435, 535 Light
530 Reflective Material
710 Main CPU
712, 723 ARM Cortex-M3 Processor
715, 725, 755 Photocell
720 RF Core
730 General Peripherals/Modules
750 Sensor Controller
756 Sensor Controller Engine

The invention claimed is:

1. A semiconductor device power management system for managing power delivery to semiconductor devices on an individual basis comprising:
    a substrate;
    a set of semiconductor devices provided on the substrate; and
    a set of independent power supply units provided on the substrate, each of the independent power supply units serving as a dedicated power supply to a corresponding one of the semiconductor devices included in the set of semiconductor devices, wherein:
    an electrical circuit is connected between at least one of the semiconductor devices and its corresponding independent power supply unit without passing through an on-off switch.

2. The semiconductor device power management system according to claim 1, wherein the set of semiconductor devices further includes:
    a first subset of semiconductor devices configured to alternate between an on-state and an off-state; and
    a second subset of semiconductor devices configured to remain in the on-state.

3. The semiconductor device power management system according to claim 2, wherein:
    the first subset of semiconductor devices is configured to transmit a sensor result signal and:
    the second subset of semiconductor devices are configured to operate as sensors to collect a set of contextual data regarding a surrounding environment of the substrate.

4. The semiconductor device power management system according to claim 3, wherein the set of contextual data includes one or more selected from the group consisting of:
    a set of biometric data;
    a set of environmental data;
    a set of luminescence data;
    a set of security data;
    a set of chemical data; and
    a set of infrastructure data.

5. The semiconductor device power management system according to claim 1, wherein the independent power supply unit is structured from a SiO2 photovoltaic material.

6. The semiconductor device power management system according to claim 5, wherein the independent power supply unit structured from the SiO2 photovoltaic material further comprises:
    a photocell including two substrates each having an electrically conductive side, the two substrates arranged such that the respective electrically conductive sides are facing each other,
    a first substrate of the two substrates is transparent on a light incident side; and
    a silicon dioxide particle compact and an electrolyte are provided between the two substrates, wherein
    the silicon dioxide particle compact is provided on a second substrate of the two substrates that is arranged to face the first substrate transparent on the light incident side; and
    the space between the silicon dioxide particle compact and the first substrate on the light incident side is filled with the electrolyte.

7. The semiconductor device power management system according to claim 6, wherein the silicon dioxide particles are one or more selected from the group consisting of:
    silicon dioxide particles having a particle diameter of 500 nm or less;
    synthetic quartz particles;
    fused quartz glass particles;
    non-alkali glass particles; or
    borosilicate glass particles.

8. The semiconductor device power management system according to claim 1, wherein the independent power supply unit is configured to generate electricity from naturally incident light.

9. The semiconductor device power management system according to claim 1, wherein the independent power supply unit is configured to generate electricity from light provided by a fiber optic cable located external to the substrate.

10. The semiconductor power management system according to claim 1, wherein the independent power supply unit is configured to generate electricity using light incident from a semi-translucent material.

11. The semiconductor device power management system according to claim 1, wherein the independent power supply unit is configured to generate electricity using light from a phosphorescent material.

12. The semiconductor device power management system according to claim 1, wherein the independent power supply unit is configured to generate electricity using light from a light-producing material.

13. The semiconductor device power management system according to claim 1, wherein the substrate is surrounded by a reflective material.

14. The semiconductor device power management system according to claim 1, further comprising a capacitor connected to the independent power supply unit and configured to store electricity from the independent power supply unit.

15. The semiconductor device power management system according to claim 1, wherein each of the independent power supply units comprises either a photocell or multiple photocells.

* * * * *

UNITED STATES PATENT AND TRADEMARK OFFICE
CERTIFICATE OF CORRECTION

| | | |
|---|---|---|
| PATENT NO. | : 11,569,212 B2 | |
| APPLICATION NO. | : 16/761558 | |
| DATED | : January 31, 2023 | |
| INVENTOR(S) | : Nobuaki Komatsu and Tomoko Ito | |

It is certified that error appears in the above-identified patent and that said Letters Patent is hereby corrected as shown below:

On the Title Page

Item (87), should read -- PCT Pub. Date: May 16, 2019 --

Signed and Sealed this
Twenty-fifth Day of April, 2023

Katherine Kelly Vidal
*Director of the United States Patent and Trademark Office*